(12) United States Patent
McCoy et al.

(10) Patent No.: US 9,678,163 B2
(45) Date of Patent: Jun. 13, 2017

(54) DIFFERENTIAL CURRENT MONITORING FOR PARALLEL-CONNECTED BATTERIES

(75) Inventors: Christopher H. McCoy, Sherborn, MA (US); David Ofer, Needham, MA (US)

(73) Assignee: TIAX LLC, Lexington, MA (US)

( * ) Notice: Subject to any disclaimer, the term of this patent is extended or adjusted under 35 U.S.C. 154(b) by 986 days.

(21) Appl. No.: 13/351,695

(22) Filed: Jan. 17, 2012

(65) Prior Publication Data

US 2012/0182021 A1    Jul. 19, 2012

Related U.S. Application Data

(60) Provisional application No. 61/461,489, filed on Jan. 18, 2011, provisional application No. 61/461,478, filed on Jan. 18, 2011.

(51) Int. Cl.
| | | |
|---|---|---|
| *G01N 27/416* | (2006.01) | |
| *G01R 31/36* | (2006.01) | |
| *G01R 19/10* | (2006.01) | |

(52) U.S. Cl.
CPC .......... *G01R 31/3606* (2013.01); *G01R 19/10* (2013.01)

(58) Field of Classification Search
USPC ........................................................ 324/433
See application file for complete search history.

(56) References Cited

U.S. PATENT DOCUMENTS

| | | | |
|---|---|---|---|
| 6,104,967 A | 8/2000 | Hagen et al. | |
| 6,204,633 B1 * | 3/2001 | Kitagawa | 320/128 |
| 6,265,850 B1 | 7/2001 | Kimura et al. | |
| 6,420,852 B1 * | 7/2002 | Sato | 320/134 |
| 6,507,184 B1 * | 1/2003 | Elston | 324/107 |
| 7,560,901 B2 * | 7/2009 | Fujikawa et al. | 320/134 |
| 7,573,394 B2 | 8/2009 | Yamashita et al. | |
| 7,795,843 B2 | 9/2010 | Keates et al. | |
| 2005/0288878 A1 | 12/2005 | Ng | |
| 2007/0069692 A1 | 3/2007 | Melichar | |

(Continued)

FOREIGN PATENT DOCUMENTS

| | | |
|---|---|---|
| JP | H05-043086 | 11/1993 |
| JP | 2000268990 A | 9/2000 |

(Continued)

OTHER PUBLICATIONS

International Search Report; International Application No. PCT/US2012/021528; International Filing Date: Jan. 17, 2012; Date of Mailing: Aug. 28, 2012; 3 pages.

(Continued)

*Primary Examiner* — Samuel Berhanu
(74) *Attorney, Agent, or Firm* — Cantor Colburn LLP

(57) ABSTRACT

A system for determining battery characteristics based on differential current monitoring includes a first battery; a second battery, the second battery being connected in parallel with the first battery; and a differential current measurement module comprising at least one current measuring device, the differential current measurement module being configured to determine a differential current associated with the first battery and the second battery. A method for determining battery characteristics based on differential current monitoring includes determining a differential current associated with a first battery and a second battery, the first battery being connected in parallel with the second battery.

20 Claims, 19 Drawing Sheets

(56) References Cited

U.S. PATENT DOCUMENTS

| | | |
|---|---|---|
| 2008/0238432 A1 | 10/2008 | Botker et al. |
| 2008/0303527 A1* | 12/2008 | Fechalos et al. ............ 324/426 |
| 2009/0055674 A1 | 2/2009 | Mueller et al. |
| 2009/0155674 A1 | 6/2009 | Ikeuchi et al. |
| 2009/0315520 A1* | 12/2009 | Nishiyama et al. .......... 320/134 |
| 2010/0188050 A1 | 7/2010 | Asakura et al. |
| 2010/0194398 A1 | 8/2010 | Kawasumi et al. |
| 2011/0001456 A1 | 1/2011 | Wang |
| 2011/0068800 A1 | 3/2011 | Nishino et al. |
| 2011/0148426 A1 | 6/2011 | Yokotani |
| 2011/0181249 A1* | 7/2011 | Deguchi et al. ............. 320/149 |

FOREIGN PATENT DOCUMENTS

| | | | |
|---|---|---|---|
| JP | 2003142165 A | 5/2003 |
| JP | 2004194410 A | 7/2004 |
| JP | 2006238619 A | 9/2006 |
| JP | 2008292403 A | 12/2008 |
| JP | 2009145137 A | 7/2009 |
| JP | 2010127858 A | 6/2010 |
| JP | 2010252566 A | 11/2010 |

OTHER PUBLICATIONS

Written Opinion of the International Searching Authority; International Application No. PCT/US2012/021528; International Filing Date: Jan. 17, 2012; Date of Mailing: Aug. 28, 2012; 5 pages.

* cited by examiner

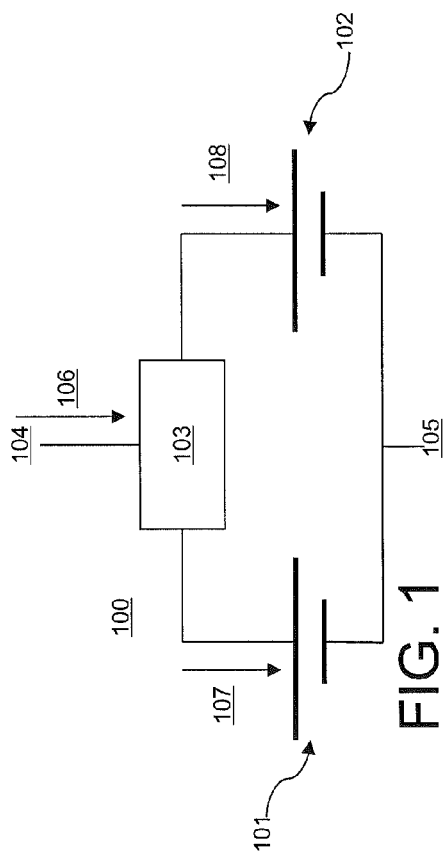
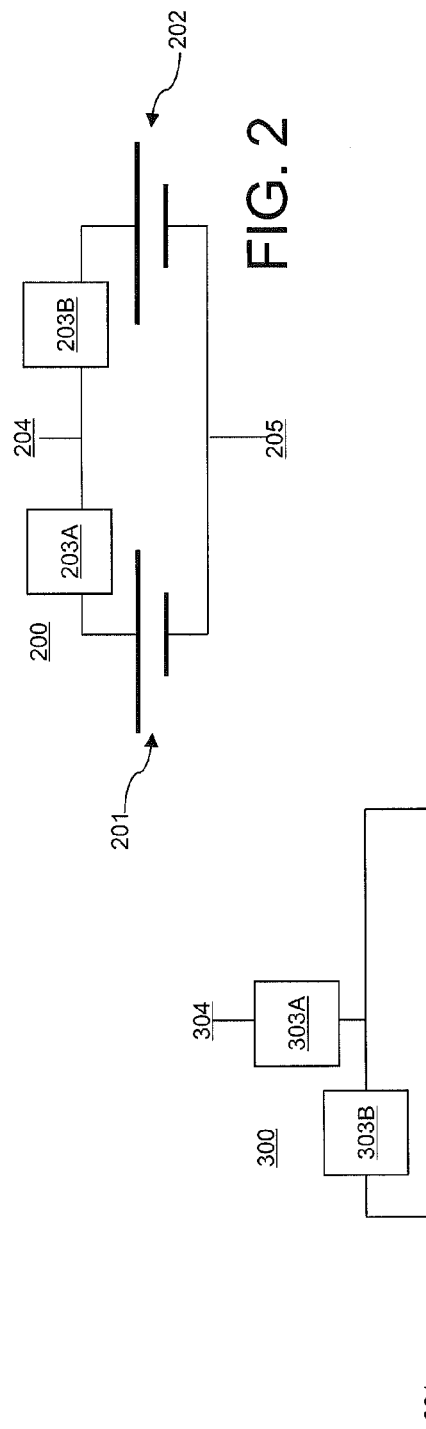
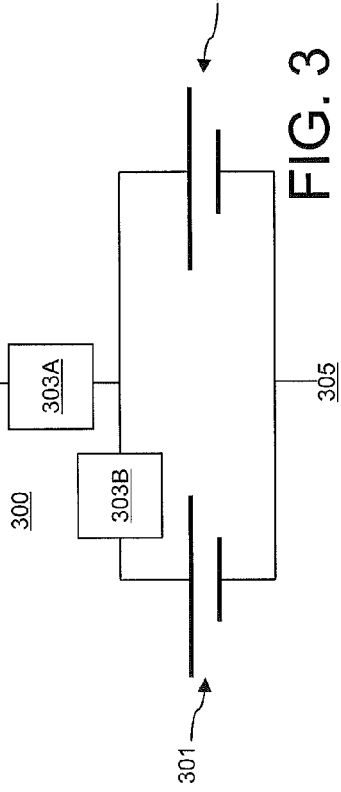

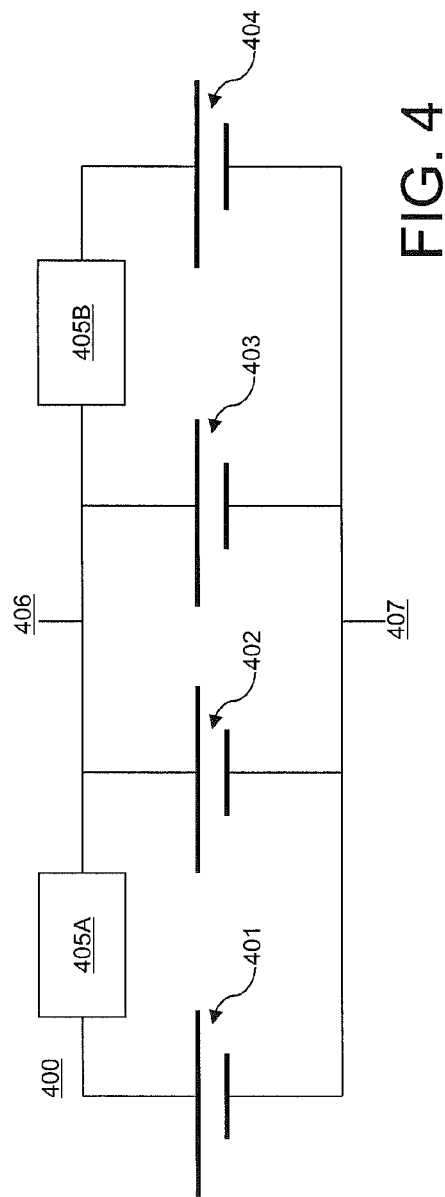
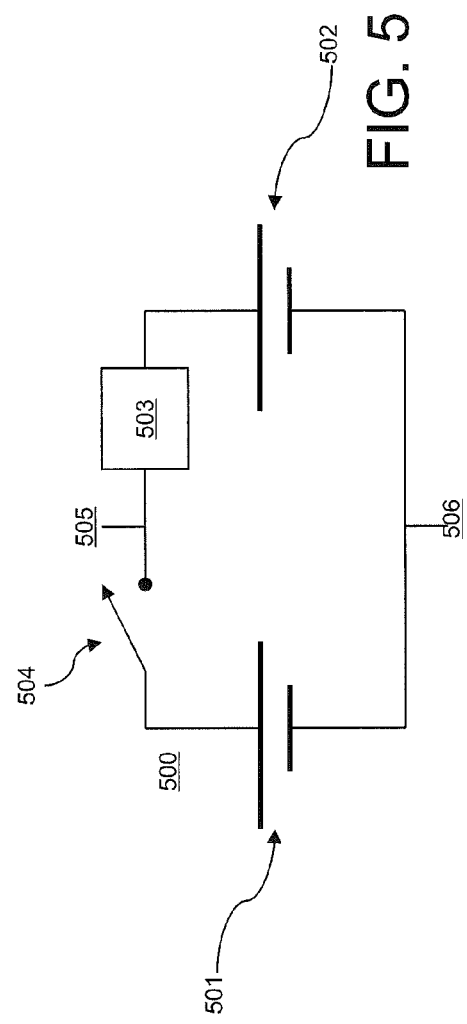

DIFFERENTIAL CURRENT MONITORING FOR PARALLEL-CONNECTED BATTERIES

BACKGROUND OF THE INVENTION (1) Field of the Invention

This disclosure relates generally to the field of monitoring of battery characteristics, and more particularly to battery monitoring based on measurement of a differential current (or inter-battery current) between batteries that are connected in parallel.

(2) Description of the Related Art

Batteries are made of one or more cells, for example lithium-ion cells, and are used to power many different types of devices. Catastrophic failures of batteries have resulted in large-scale recalls costing hundreds of millions of dollars and in significant damage to company reputation and brand image. As the energy content of batteries continues to rise, the potential for serious failures becomes a major concern. Catastrophic battery failure may include a thermal runaway event in which an internal short circuit inside a cell initiates a self-accelerating decomposition reaction inside the cell. Thermal runaway events may include smoke, flames, or even an explosion if intervention is not performed in a timely manner.

Several different approaches are available to detect short circuits in battery cells by monitoring cell or cell block voltages. In these approaches, cell or cell block voltage changes are monitored when no charging or discharging is taking place in the cell in order to detect a drop in voltage across the cell that may be associated with an internal short circuit. Monitoring of cell voltage over time while a cell is at rest (i.e., when there is no charge or discharge current flowing in the cell) is used in the lithium-ion industry by cell manufacturers as a quality control test. Following assembly of the cell and initial charging, cells are left at rest for a period of time and cell voltage is monitored. A decline in cell voltage beyond a certain value can indicate the presence of an internal short in the cell, thus allowing the cell to be rejected as faulty. Such voltage tests do not identify cells that will develop internal short circuits later in their life cycle, which may lead to catastrophic failures of cells that develop internal short circuits during operation. Further, monitoring of cell voltage when a cell is at rest has a relatively low sensitivity with respect to detection of internal shorts because an internal short may require an extended period of time to have a sufficiently large impact on cell voltage to allow unambiguous confirmation of whether an internal short is present in the cell. If a short is allowed to develop too far, a point-of-no-return may be reached where it is no longer possible to avoid thermal runaway and catastrophic cell failure.

BRIEF SUMMARY OF THE INVENTION

An exemplary embodiment of a system for determining battery characteristics based on differential current monitoring includes a first battery; a second battery, the second battery being connected in parallel with the first battery; and a differential current measurement module comprising at least one current measuring device, the differential current measurement module being configured to determine a differential current associated with the first battery and the second battery.

Another exemplary embodiment of a system for determining battery characteristics based on differential current monitoring includes a first battery; a second battery, the second battery being connected in parallel with the first battery; and a differential current measurement module configured to determine a differential current associated with the first battery and the second battery, wherein the differential current measurement module comprises a switch and a current measuring device located between the first battery and the second battery.

An exemplary embodiment of a method for determining battery characteristics based on differential current monitoring includes determining a differential current associated with a first battery and a second battery, the first battery being connected in parallel with the second battery.

Additional features are realized through the techniques of the present exemplary embodiment. Other embodiments are described in detail herein and are considered a part of what is claimed. For a better understanding of the features of the exemplary embodiment, refer to the description and to the drawings.

BRIEF DESCRIPTION OF THE DRAWINGS

Referring now to the drawings, wherein like elements are numbered alike in the several FIGURES, the above and other aspects, advantages, and features of this disclosure will become more apparent by describing in further detail exemplary embodiments thereof with reference to accompanying drawings, in which:

FIGS. 1-7 illustrate embodiments of differential current monitoring systems for parallel-connected batteries;

DETAILED DESCRIPTION OF THE INVENTION

Figure 6:
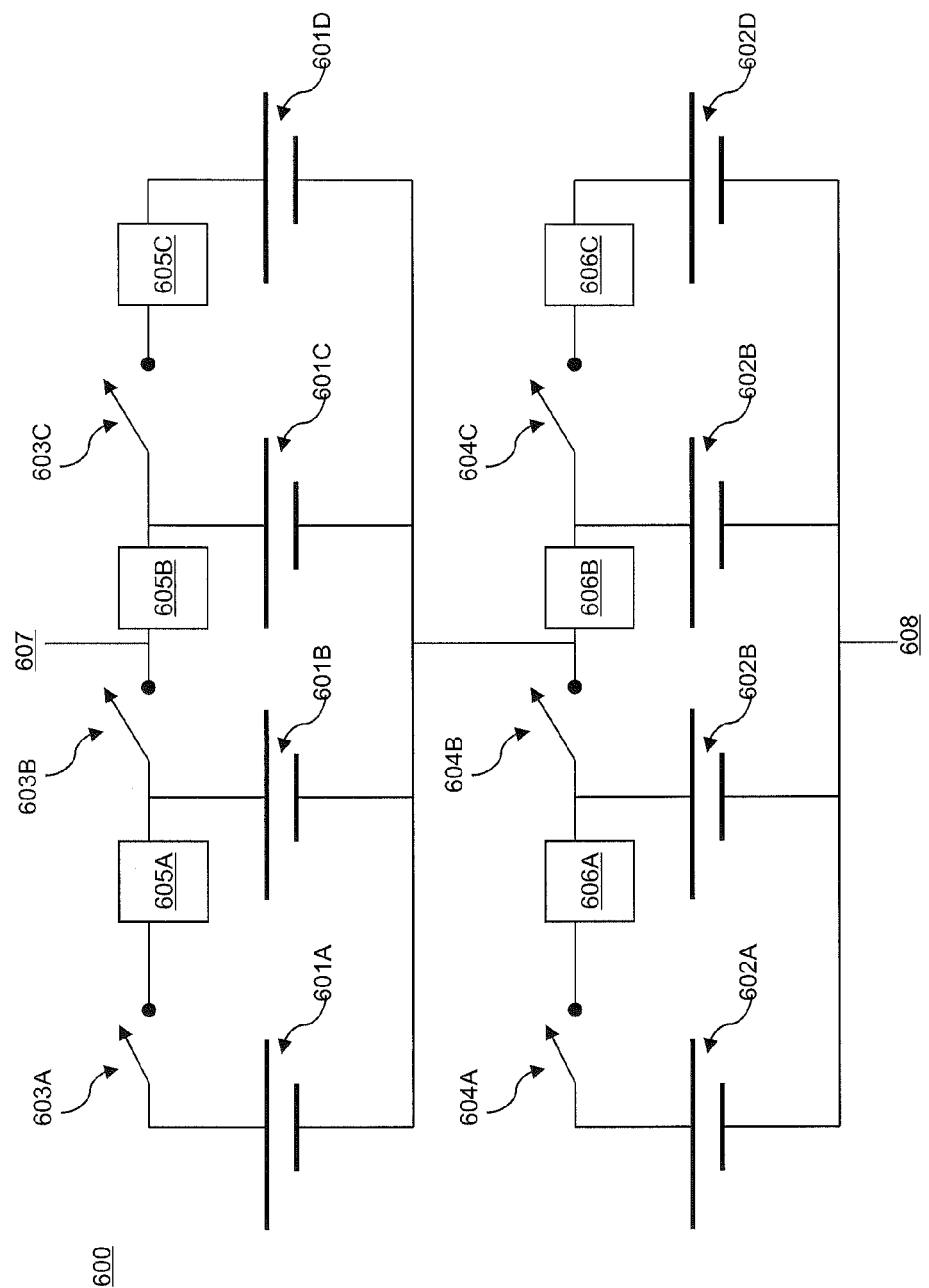

Embodiments of systems and methods for differential current monitoring for parallel-connected batteries are provided, with exemplary embodiments being discussed below in detail. Measurement of a differential current (which may also be referred to as inter-battery current) between two batteries that are connected in parallel may be used to determine various characteristics of the batteries, as a net flow of current from one of the parallel-connected batteries to the other indicates a difference in characteristics between the two batteries. For example, the differential current may be used to accurately detect a fault, such as an internal short, in one of the parallel batteries. In various embodiments, such fault detection may be used to prevent violent battery failure, including thermal runaway conditions, during battery usage, or may be used to identify faulty battery cells during a manufacturing process before the cells are assembled into battery packs, allowing cells that are identified as faulty to be discarded.

When current is flowing to a pair of parallel connected batteries, for example during charge and discharge processes, current flows associated with normal battery behavior are observed in both batteries as a common-mode signal. Therefore, when the differential current between the two parallel batteries is examined, the relatively large common-mode current signals associated with normal battery operation cancel out, leaving behind relatively a small current differential current signal. Parallel batteries share current relatively equally, and the differential current for a pair of parallel batteries is ideally zero. In practice, however, some inequality may be expected given small cell-to-cell variations in characteristics at beginning of battery life, and larger inequality may develop if cells age differently, resulting in a parallel block of batteries that is made up of batteries of significantly different capacity. However, even in the case where battery capacities in a parallel block of cells are significantly different, the net differential current between healthy batteries averages to approximately zero over time. If one battery has a higher capacity and thus delivers more current during discharge, this battery will also accept more current during charge, so that net charge balance across two parallel batteries is maintained as long as neither battery in the parallel pair is discharging internally due to, for example, an internal short. Therefore, the health of the batteries may be monitored based on identification of a differential current comprising a net flow of charge from one parallel battery to the other over the course of one or more complete cycles, or by differential current flow that does not decay to a relatively low value after overall battery charge/discharge currents have ceased.

Measurement of differential current may be passive or active. In embodiments in which the differential current measurement is passive, a differential current measurement module including one or more current measuring devices is used to determine the differential current between the two parallel-connected batteries during operation, and the determined differential current is monitored over time to determine any changes in characteristics in the parallel-connected batteries. The differential current signal from the pair of parallel batteries may be analyzed using various signal analysis methods. For example, the presence of a differential current having a substantially non-zero value when the batteries are at rest may be indicative of an internal short circuit in one of the batteries. In another example, differential current data (e.g., current vs. time or current vs. capacity) may be integrated over a time period in order to determine whether or not a net transfer of charge from one battery to another parallel battery is occurring. In yet another example, the average value of the differential current over a particular period of time and/or a number of charge-discharge cycles may be observed; or a shift in magnitude of the average differential current away from zero may indicate the presence of an internal short circuit.

In other embodiments in which the differential current measurement is active, the differential current measurement module includes a switch and a current measuring device that are located in between the two parallel-connected batteries. The batteries are disconnected for a diagnostic time period and then reconnected via the switch. A battery that is free of internal shorts will maintain stable terminal voltages over time, and will therefore show a relatively low differential current when reconnected. However, if an internal short is present in one of the batteries, that battery will experience discharge current during the diagnostic time period. Therefore the presence of a differential current, comprising an inrush of current from one of the batteries to the other after the batteries are reconnected, indicates the presence of a fault in the battery that receives the inrush of current. Because an internal short condition in one battery will result in a relatively large inrush current when the batteries are reconnected, the presence of an internal short in one of the batteries may be determined by comparing the differential current signal to a minimum fault threshold.

Differential current may be measured for two parallel batteries that comprise single cells or pluralities of cells that are connected in parallel and/or in series in various embodiments, and may be used to determine battery characteristics at any point in the life cycle of a cell, for example, before or after the cell has been assembled into a battery pack. The two parallel batteries may comprise different configurations in some embodiments. Inclusion of multiple current measuring devices, and, in some embodiments, switches, in a battery pack that includes a plurality of cells in parallel allows determination (e.g., identification) of an individual cell that contains a fault. Such a battery pack may include any appropriate number of cells that are connected as parallel units, and analysis of individual cell currents may be extended to a pack with any appropriate number of cells connected as parallel sub-units of the overall pack. The battery pack may include any appropriate type of battery, including but not limited to a lithium-ion, a lead-acid, a nickel-cadmium, or a nickel-metal hydride battery in various embodiments. Such a battery pack may be incorporated into any appropriate electrical device, including but not limited to laptop or notebook computers, power tools, hybrid electric vehicles, plug-in hybrid electric vehicles, electric vehicles, energy storage systems, and military equipment.

FIG. 1 illustrates an embodiment of a differential current monitoring system 100 for parallel-connected batteries 101 and 102. Current flows from terminal 104 through differential current measurement module 103 to the two batteries 101 and 102 to terminal 105. Current 106 is the total current ($I_{total}$) to both batteries 101 and 102. Current 107 ($I_1$) is associated with battery 101, and current 108 ($I_2$) is associated with battery 102. $I_{total}$ is equal to $I_1$ plus $I_2$. The differential current measurement module 103 determines the differential current between batteries 101 and 102, which is equal to the difference between $I_1$ and $I_2$. The differential current measured by differential current measurement module 103 is used to monitor the characteristics of batteries 101 and 102. The differential current measurement module 103 also includes logic to collect and analyze the differential current data; any appropriate logic may be included in differential current measurement module 103 to collect and analyze the differential current data. Batteries 101 and 102 may comprise single cells or pluralities of cells that are connected in any appropriate configuration of parallel and/or in series in various embodiments; batteries 101 and 102 may also comprise different battery configurations.

The differential current measurement module 103 may include one or more current measuring devices in various embodiments, and in further embodiments may include a switch for disconnecting and reconnecting batteries 101 and 102. The current measuring device(s) of differential current measurement module 103 may be any appropriate current measuring devices, including but not limited to Hall Effect transducers, current sense resistors, induction sensors, current shunts, or current sense resistors with amplification. A current sense resistor with amplification includes a current sense resistor and amplification hardware so that the voltage drop across the current sense resistor may be kept relatively small (i.e., so that the insertion loss resulting from the sense resistor is relatively small), while the amplification hardware outputs a relatively large magnitude output voltage signal that is related to the current flowing through the current sense resistor for analysis. In embodiments in which the differential current measurement module 103 includes a switch, the switch may comprise any appropriate type of fuse or switch, including but not limited to relays, solid state switches, thyristors, mechanical switches, or metal oxide semiconductor field effect transistors (MOSFET) in some embodiments. In embodiments in which the switch is a MOSFET, the MOSFET may also comprise the current measuring device, as the differential current through the MOSFET may be determined based on the drain-source voltage drop across the MOSFET. Batteries 101 and 102 may be any appropriate type of batteries, including but not limited to lithium-ion, lead-acid, nickel-cadmium, or nickel-metal hydride batteries in various embodiments.

The differential current may be measured by differential current measurement module 103 using several different approaches; various embodiments of a differential current measurement module such as differential current measurement module 103, and various battery configurations for use in conjunction with one or more differential current measurement modules, are discussed below with respect to FIGS. 2-7. A first approach includes respective current measuring devices to measure $I_1$ and $I_2$ (discussed below in further detail with respect to FIG. 2). A second approach includes respective current measuring devices to measure $I_1$ (or $I_2$) and $I_{total}$, and then calculating of $I_2$ (or $I_1$) from the measured values (discussed below in further detail with respect to FIG. 3). A third approach includes a current measuring device to measure $I_1$ (or $I_2$), with the value of $I_{total}$ being acquired from other sources, such as a battery management unit, and then calculating of $I_2$ (or $I_1$) from the measured values. A fourth approach includes a single current measuring device that directly measures the differential current flowing from battery 101 to battery 102 (or vice versa), which may be performed in cases in which $I_{total}$ is equal to zero. This approach may be used in a differential current measurement module 103 that includes a switch (discussed below in further detail with respect to FIGS. 5-7). In further embodiments, battery behavior may be monitored by comparing the differential current signal from a first pair of parallel batteries to the differential current signal provided by a second pair of parallel batteries of the same type in a battery pack (discussed below in further detail with respect to FIG. 4). If significant deviation between the two differential current signals is detected, a fault in one of the parallel pairs of batteries may be indicated. Any of the batteries, and differential current measurement modules (comprising one or more current measuring devices and, in some embodiments, switches), that are discussed below with respect to FIGS. 2-7 may comprise any of the devices and configurations discussed with respect to FIG. 1. Any appropriate logic may be used in conjunction with the differential current measurement modules of FIGS. 2-7 to collect and analyze the differential current data; various analysis techniques are discussed below with respect to FIGS. 10-22. In some embodiments, an average value of the differential current over a predetermined time period may be determined, and a fault in one of the two parallel batteries may be detected based on the determined average value by, for example, detecting a shift in a magnitude in the average value of the differential current during the predetermined time period. In other embodiments, the differential current may be compared to a minimum fault threshold.

FIG. 2 illustrates an embodiment of a passive differential current monitoring system 200 for parallel-connected batteries 201 and 202. Current flows from terminal 204 through a differential current measurement module comprising current measuring devices 203A-B, through the two batteries 201 and 202 to terminal 205. The differential current of batteries 201 and 202 is given by the difference in the current signals output by current measuring device 203A ($I_1$, associated with battery 201) and current measuring device 203B ($I_2$, associated with battery 202). FIG. 3 illustrates another embodiment of a passive differential current monitoring system 300 for parallel-connected batteries 301 and 302. Current flows from terminal 304 through a differential current measurement module comprising current measuring devices 303A-B, through the two batteries 301 and 302 to terminal 305. Current measuring device 303A gives $I_{total}$, and current measuring device 303B gives $I_1$; $I_2$ is equal to the difference between $I_{total}$ and $I_1$, allowing calculation of the differential current between batteries 301 and 302. In another embodiment of the system of FIG. 3, current measuring device 303A may be omitted and $I_{total}$ may be received from another source (not shown), such as a battery management unit.

FIG. 4 illustrates an embodiment of a passive differential current monitoring system 400 for parallel-connected batteries 401, 402, 403, and 404, in which two sets of two parallel batteries provide reference differential current signals for one another. Current flows from terminal 406 through differential current measurement module 405A, which determines the differential current between parallel batteries 401 and 402, and current measurement module 405B, which determines the differential current between parallel batteries 403 and 404, to terminal 407. The differential current measurement modules 405A-B may determine their respective differential currents in any appropriate manner. The differential current signals from differential current measurement modules 405A-B are then compared to each other. If significant deviation between the two differential current signals from differential current measurement modules 405A-B is detected, a fault in one of the pairs of parallel of batteries 401/402 or 403/404 may be indicated. Any appropriate logic may be associated with differential current measurement modules 405A-B to collect, compare, and analyze the differential current data.

FIG. 5 illustrates an embodiment of an active differential current monitoring system 500 for parallel-connected batteries 501 and 502 in which the differential current measurement module comprises a switch 504 and a current measuring device 503. Active differential current measurement in the system 500 is performed as follows, and is also discussed in further detail below with respect to FIG. 9. First, switch 504 is closed and batteries 501 and 502 are allowed to equilibrate such that a substantially steady-state current flow is achieved. Switch 504 is then opened for a period of time corresponding to a diagnostic time period, the length of which can be selected according to a desired level of sensitivity with respect to detecting any internal shorts in batteries 501 or 502. The longer the diagnostic time period, the greater effect an internal short circuit will have on the state-of-charge of a battery containing a short. Following the diagnostic time period during which switch 504 is open, switch 504 is closed and the differential current flow between batteries 501 and 502 is measured by current measuring device 503. If battery 501 and battery 502 are free of internal shorts, both batteries 501 and 502 will maintain stable states-of-charge during the diagnostic time period, and little or no current flow will be detected by current measuring device 503 when switch 504 is closed at the end of the diagnostic time period. However, if, for example, battery 502 contains an internal short, discharge into that internal short during the diagnostic time period will discharge battery 502 during the diagnostic time period, while the state-of-charge of battery 501 will remain stable. Thus, upon reconnection of batteries 501 and 502 at the end of the diagnostic time period, a surge of current flow into battery 502 will result. This current flow indicates the presence of an internal short in battery 502. The magnitude of the current flow detected by the current measuring device 503 is related to the magnitude of the internal short, and the direction of the current flow indicates which of batteries 501 or 502 contains the internal short. During the active differential current testing, $I_{total}$ between terminals 505 and 506 of system 500 is equal to zero. In some embodiments, logic associated with current measuring device 503 may compare the measured differential current to a minimum threshold to determine the presence of a short in one of batteries 501 or 502. Switch 504 may be one of a relay, a solid state switch, a thyristor, a mechanical switch, and one or more MOSFETs in various embodiments.

FIG. 6 illustrates another embodiment of an active differential current monitoring system 600 for a battery pack configured with two blocks of parallel batteries, 601A-D and 602A-D, that are connected in series. The battery pack provides power to a device via terminals 607 and 608. The parallel connection of each battery to its neighboring parallel battery(s) is made via a respective differential current measurement module that includes one of switches 603A-D/ 604A-C, and a respective associated current measuring device 605A-C/606A-C. To determine the presence of a fault in system 600, switches 603A-D and 604A-D are closed until steady state is achieved in batteries 601A-C and 602A-C, and then a subset of switches 603A-C and 604A-C are opened for a diagnostic time period. After the diagnostic time period, the opened switches are closed, and determinations of differential current flow are made by the current measuring devices of 605A-C and 606A-C that are associated with the switches that were closed. Sequences of opening and closing of various subsets of switches 603A-C and 604A-C may be used to determine an individual battery of batteries 601A-C and 602A-C that contains a fault. For example, switches 603A and 603C may be closed while switch 603B is opened for a diagnostic time period, and then switch 603B is closed to determine the presence of a fault in one of parallel batteries 601A-C and parallel batteries 601C-D. If, for example, current measuring device 605B indicates a differential current flowing in the direction of batteries 601A-B from batteries 601C-D, a fault is indicated in one of batteries 601A-B. Switch 603B may then be opened to isolate batteries 601A-B, and switch 603A and current measuring device 605A may then be used to determine which of batteries 601A-B contains the fault. In some embodiments, it may be unnecessary to identify which individual battery is faulty if effective intervention (for example, to prevent thermal runaway) can be performed based on the knowledge that one battery in the pack has developed an internal short. However, if the specific battery containing an internal short can be identified, it may be possible to selectively isolate that battery, by, for example, opening appropriate switches, while still allowing other batteries in the pack to provide power to the battery pack terminals 607 and 608, thereby maintaining safety by preventing current flow into the battery containing an identified internal short, but maintaining overall function of the battery in order to allow, for example, a controlled shut-down of the device that the battery is powering.

Figure 7:
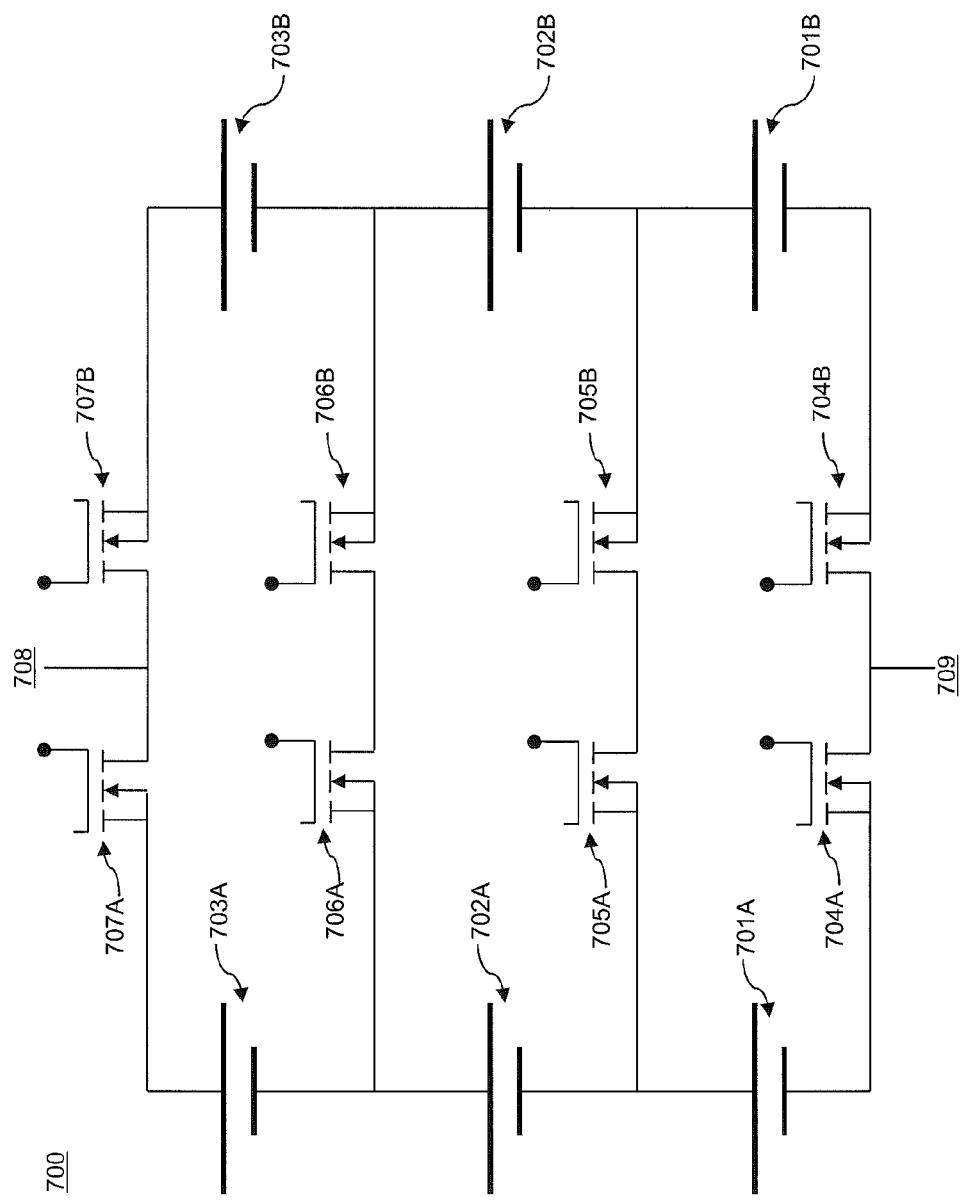

FIG. 7 illustrates another embodiment of an active differential current monitoring system 700 for a battery pack configured with three blocks of parallel batteries 701A-B, 702A-B, and 703A-B. The battery pack of system 700 provides power at terminals 708 and 709. The differential current measurement devices of FIG. 7 include MOSFETs 704A-B, 705A-B, 706A-B, and 707A-B. The MOSFETs 704A-B, 705A-B, 706A-B, and 707A-B act as both switches and current measuring devices, as the current flowing through a MOSFET may be determined based on the drain-source voltage drop across the MOSFET. Sequences of opening and closing of various subsets of MOSFETs 704A-B, 705A-B, 706A-B, and 707A-B may be used to determine an individual battery of batteries 701A-B, 702A-B, and 703A-B that contains a fault. The MOSFETs 704A-B, 705A-B, 706A-B, and 707A-B may also be opened to shut down the entire battery pack in the event a short is detected in any of the batteries 701A-B, 702A-B, and 703A-B, or a subset of MOSFETs 704A-B, 705A-B, 706A-B, and 707A-B may be opened to isolate a single faulty battery in the system 700 while the remaining batteries continue to provide power at terminals 708 and 709.

Figure 8:
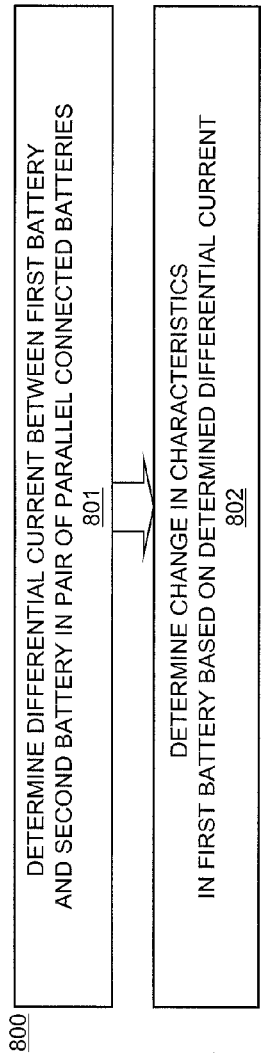
FIGS. 8-9 illustrate flowcharts of embodiments of methods for differential current monitoring for parallel-connected batteries.

FIG. 8 illustrates a flowchart of a method 800 for differential current-based battery monitoring. FIG. 8 may be implemented in any of the systems of FIGS. 1-7 described above. First, in block 801, a differential current (i.e., inter-battery current) between a first battery and a second battery that are connected in parallel is determined by a differential current measurement device. Then, in block 802, a change in characteristics in the first battery is detected based on the determined differential current. The change in characteristics may be detected using any appropriate signal analysis techniques of the differential current data. In some embodiments the differential current signal may be compared to a minimum fault threshold. In other embodiments, differential current data (e.g., current vs. time or current vs. capacity) may be integrated over a time period in order to determine whether or not a net transfer of charge from one battery to another parallel battery is occurring, where a net transfer of charge from one battery to another is indicative of an internal short circuit. In yet another embodiment, the average value of the differential current over a particular period of time and/or a number of charge-discharge cycles may be observed; a shift in magnitude of the average differential current away from zero may indicate the presence of an internal short circuit. The detected change in characteristics may comprise identification of a fault such as an internal short in the first battery in some embodiments.

Figure 9:
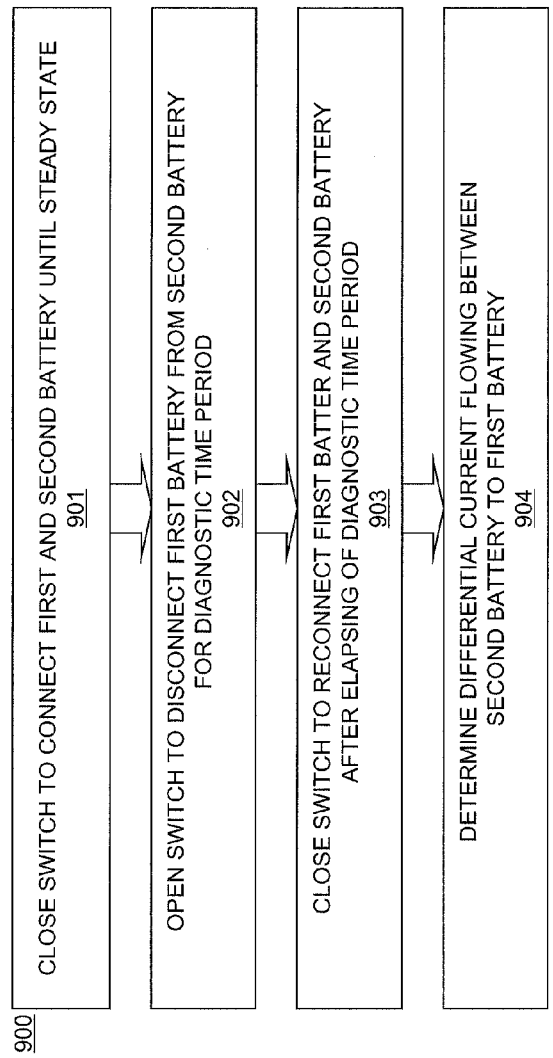

FIG. 9 illustrates a flowchart of an embodiment of a method 900 for determining a differential current between a first battery and a second battery, as is performed in block 801 of FIG. 8. Method 900 may be implemented in any of the systems of FIGS. 1 and 5-7 described above. First, in block 901, a switch that is located between the first battery and the second battery is closed until the first battery and the second battery reach a steady state. Steady state may be defined based on the length of the diagnostic time period (discussed below in block 902). In some embodiments, the steady state may be a point at which a current flow between the two batteries stabilizes such that it changes by less than 10% of its highest magnitude during a period equal to the intended diagnostic time period during which the batteries are to be disconnected from on another.

Figure 23:
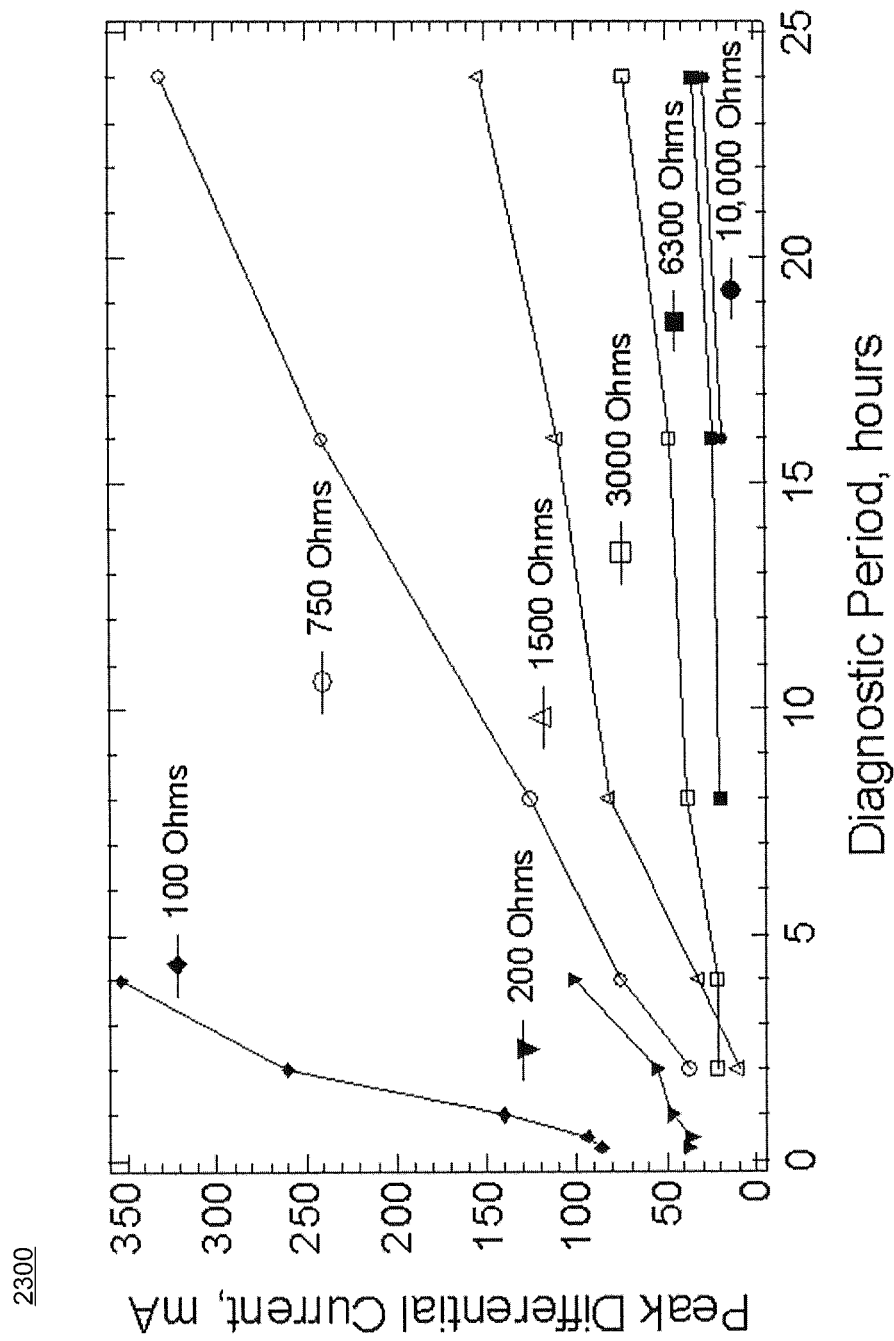
FIG. 23 shows a graph of differential current detection sensitivity data versus diagnostic time period for an example battery.

Then, in block 902, the switch is opened for a diagnostic time period. The diagnostic time period may range from about 15 minutes to about 24 hours in various embodiments, and may vary based on the type of batteries present in the system. The longer the diagnostic time period, the more sensitive the system will be to detection of an internal short after reconnection. FIG. 23 shows a graph 2300 of sensitivity (i.e., peak differential current, in milliamps, or mA) versus diagnostic time period data for an example 2.4 amp-hour 18650-format battery cell. In FIG. 23, the diagnostic time period ranges from 15 minutes to 24 hours. As can be seen in FIG. 23, a 100 ohm short can be detected using a 15 minute diagnostic time period. For more minor shorts (e.g. 3000 or 6300 ohms), a diagnostic time period of a number of hours is needed. Detecting a short that draws a given current will also require a longer diagnostic time period as the capacity of the parallel batteries involved is larger. When the batteries are at rest and have been at rest for a minimum time period (for example from about 0.5 to about 2 hours) the diagnostic time period may be small, on the order of a few minutes. If charge and discharge are occurring in the batteries, the diagnostic time period may be preceded by the minimum rest period after charge and discharge processes have ceased. Then, in block 903, after elapsing of the diagnostic time period, the switch is closed and the batteries are reconnected. Lastly, in block 904, the current measuring device associated with the switch detects the presence of a differential current between the first battery and the second battery.

Figure 10:
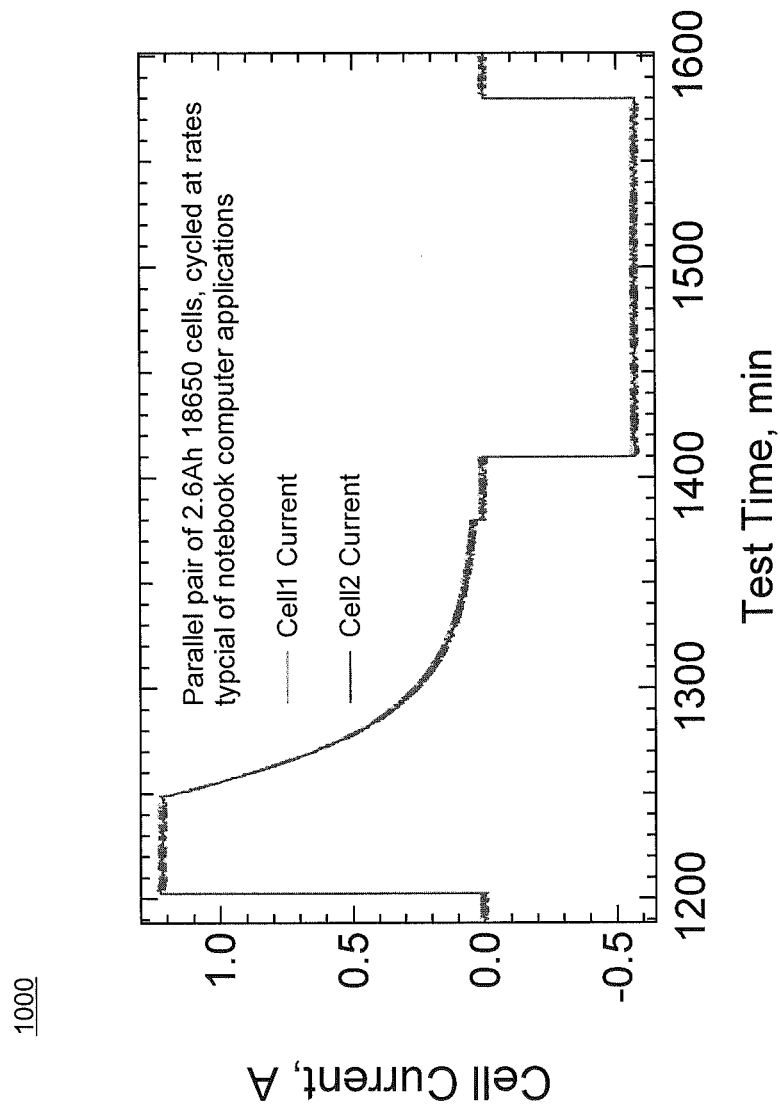
FIG. 10 shows a graph of individual cell currents for a pair of example short-free cells in parallel.
Figure 11:
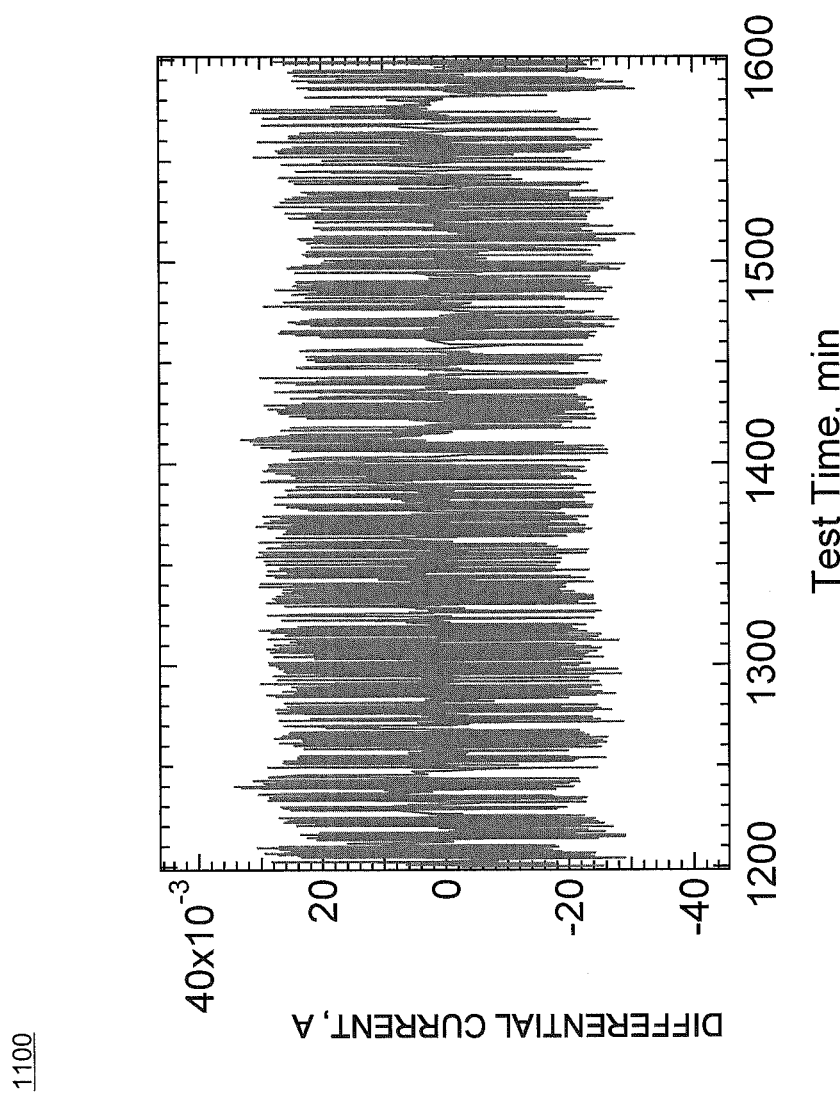
FIG. 11 shows a graph of differential current data for the cells of FIG. 10.
Figure 12:
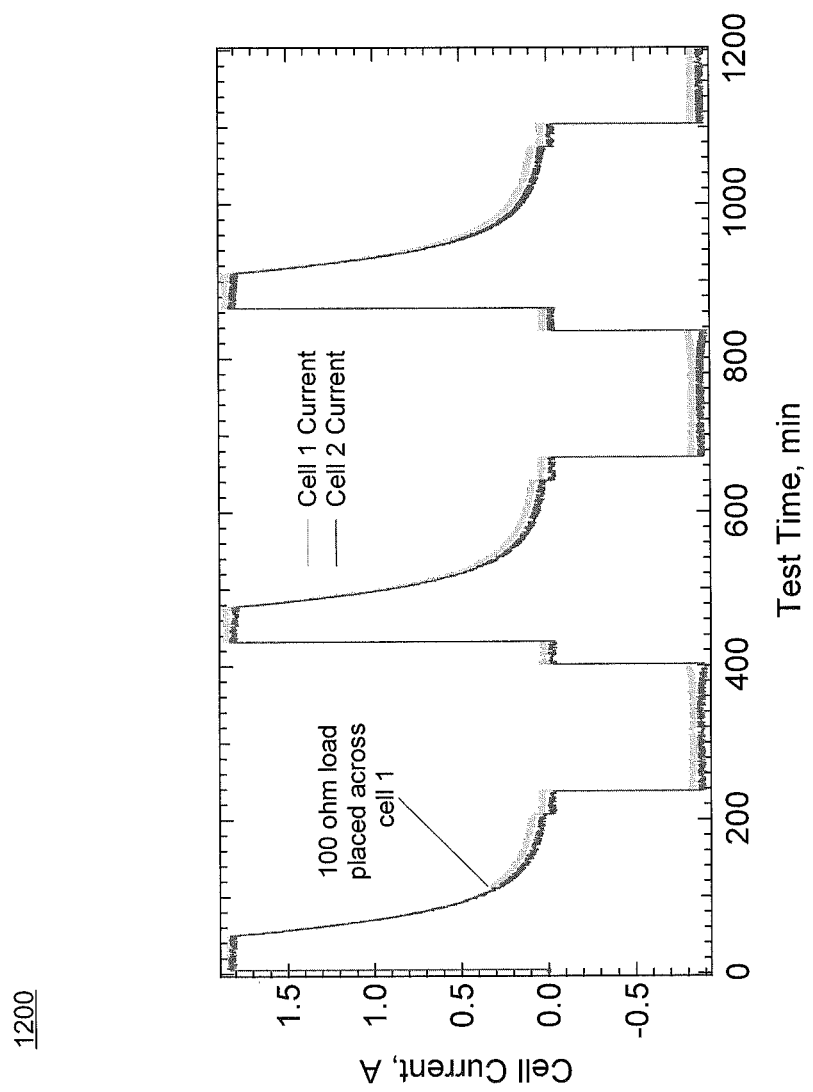
FIG. 12 shows a graph of individual cell currents for a pair of example cells in parallel that include a short.
Figure 13:
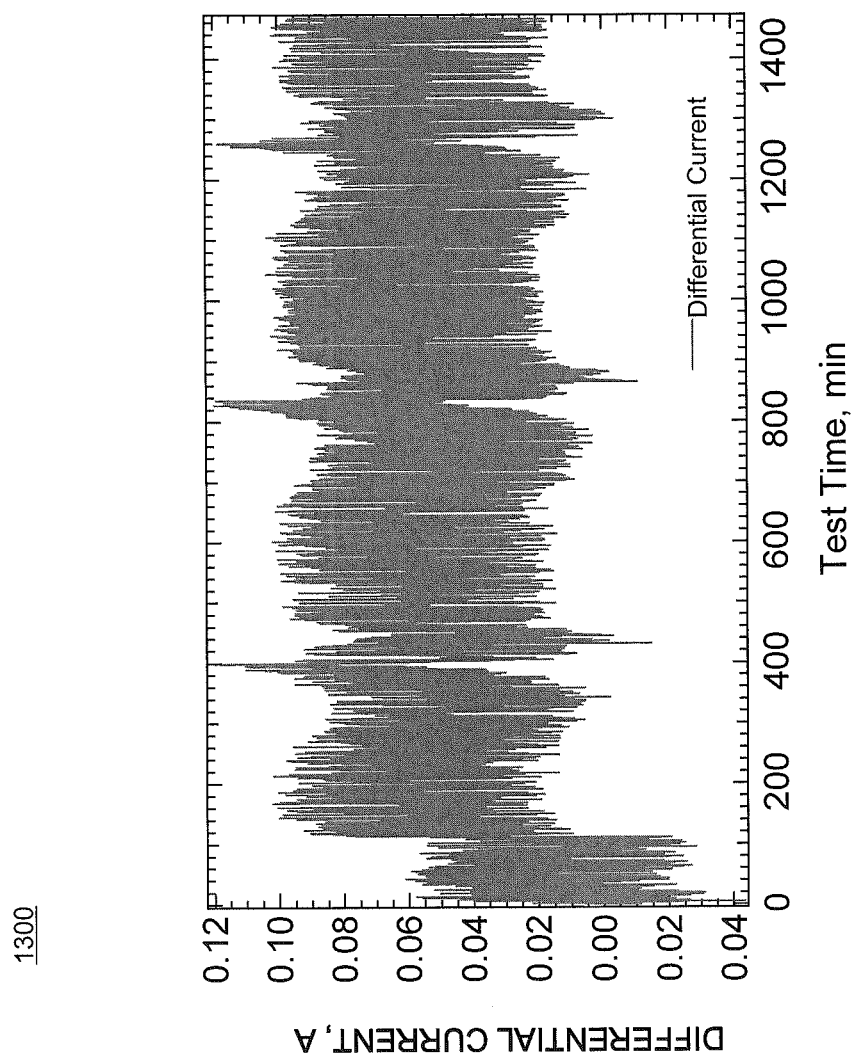
FIG. 13 shows a graph of differential current data for the cells of FIG. 12.

Differential current data for example parallel batteries and various signal analysis techniques that may be used in block 802 of method 800 of FIG. 8 are discussed below with respect to FIGS. 10-22. FIG. 10 shows a graph 1000 of individual cell current (in amps, or A) over time for a pair of parallel short-free 2.6 Ah 18650 lithium ion cells during cycling, and FIG. 11 shows a graph 1100 of the differential current between the cells of FIG. 10. FIG. 10 simulates standard notebook computer charge and discharge rates. The current is shared nearly equally between the two cells, as can be seen in FIG. 11, which shows that the value of the measured differential current for the two cells is a very small faction of charge and discharge current for the cell pair. The differential current signal is primarily noise, with the far larger charge and discharge currents appearing as common-mode signals at both cells and dropping out. Turning to FIGS. 12 and 13, differential current data over time for similar parallel batteries with a short is shown. FIG. 12 shows a graph 1200 of individual cell currents for a parallel pair of 18650 cells with a 100 ohm load across one of the cells to simulate a minor short in the cell, and FIG. 13 shows a graph 1300 of the differential current flowing between cells of FIG. 12. The presence of the relatively minor short in one cell results in a relatively small current. A deviation from equal current sharing can be observed at the point when the load simulating the short is connected to the batteries. In particular, in FIG. 13 there is a transition in the average value of the differential current occurring at about 110 minutes, which is the point at which the resistor was connected across one of the cells.

The differential current data shown in FIG. 11 has an average value of about 1.90 mA, while the differential current data shown in FIG. 13 has an average value of 51.5 mA. By analyzing the average differential current, a determination can be made regarding whether or not significant net transfer of charge is occurring between two or more parallel cells. An average value of about 1.90 mA, as shown in FIG. 11, is relatively small when measurement error and noise level is considered, and thus it can be concluded that no significant internal short is present, while the 51.5 mA differential current value shown in FIG. 13 is an indicator of sustained current flow from one cell into the other, and thus an internal short. While a false negative result could be obtained if internal shorts of the same magnitude and rate of growth were present in both cells at the same time, the probability of such a coincidental formation of simultaneous shorts having similar characteristics is relatively small.

Figure 14:
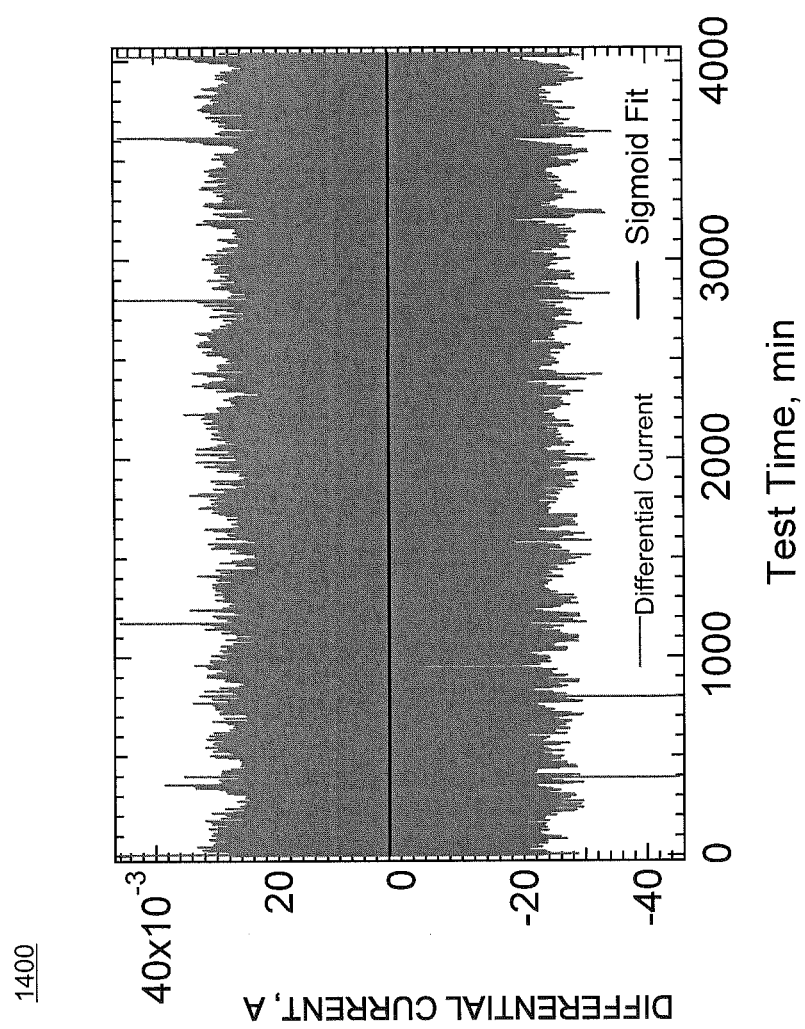
FIG. 14 shows a graph of the data of FIG. 11 fit to a sigmoid function.
Figure 15:
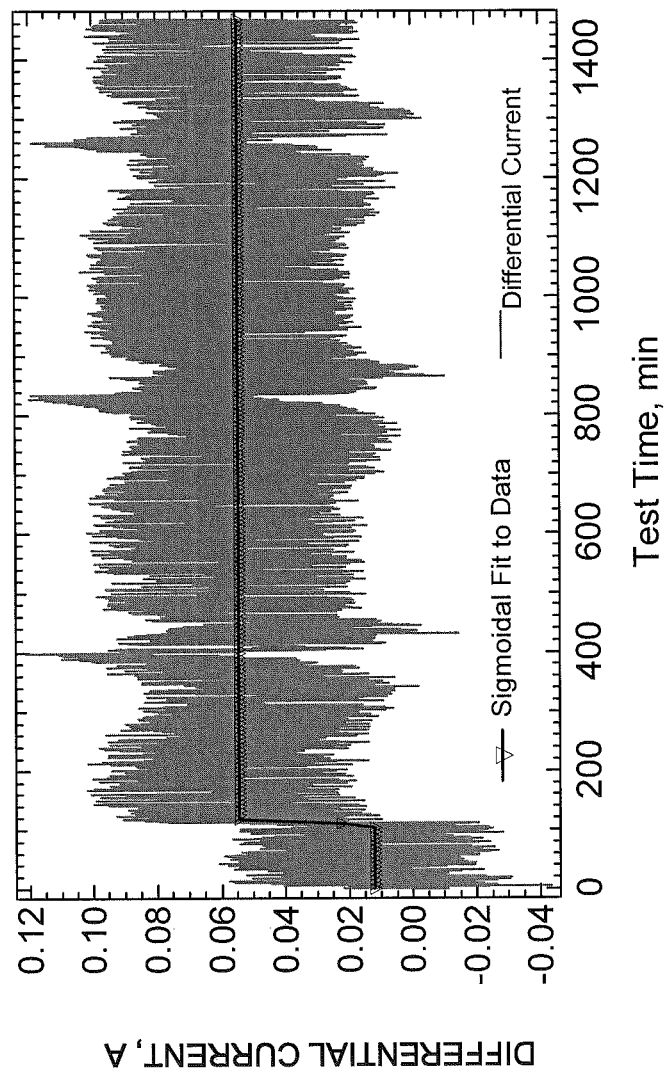
FIG. 15 shows a graph of the data of FIG. 13 fit to a sigmoid function.

A transition from a short-free condition to a shorted condition may also be determined by fitting differential current data to a sigmoid function. The sigmoid function provides a mathematical representation of system that undergoes a transition from one state to a different state and proves an effective means of identifying such transitions even in the presence of significant signal noise. FIG. 14 shows a graph 1400 of the data of FIG. 11 fit to a sigmoid function. Graph 1400 shows no transitions within the differential current data, and thus indicates that no internal short has appeared in either cell. FIG. 15 shows a graph 1500 of a sigmoid fit to the differential current data of FIG. 13 that includes short conditions. As can be seen in FIG. 15, a transition from a short-free condition to the presence of a 100 ohm short at a time of about 110 minutes is identified by the fit.

Figure 16:
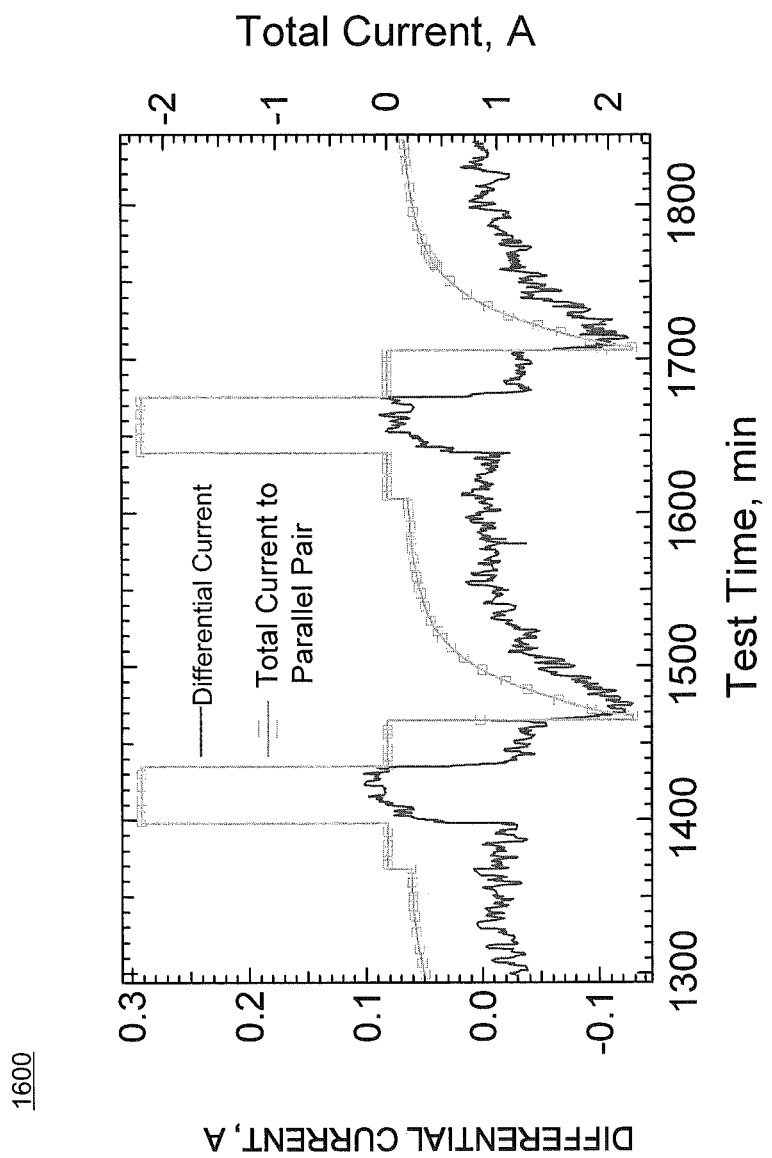
FIG. 16 shows a graph of differential current and total current data for a pair of example short-free cells in parallel.

FIG. 16 shows a graph 1600 of differential current (amperes, A) and total current (amperes, A) over time in a parallel pair of healthy (i.e., short-free) cells. Healthy cells when cycled in parallel will share current approximately equally, but not share current with perfect balance, thus some differential current will be observed. However, the differential current signal observed in short-free cells typically bears a relationship to overall current in the parallel pair of cells, as can be seen from the data in FIG. 16. Using this relationship, it is possible to analyze the differential current by deconvolution of the signal components in the differential current that are associated with normal charge and discharge processes from any signal components that might indicate an internal short process, which would not bear a correlative relationship to overall charge and discharge current for the cell pair. While the amplitudes of the waveforms in graph 1600 differ by an order of magnitude or so, it can be seen that during normal (short-free) cycling, differential current tracks total current in a predictable manner.

Figure 17:
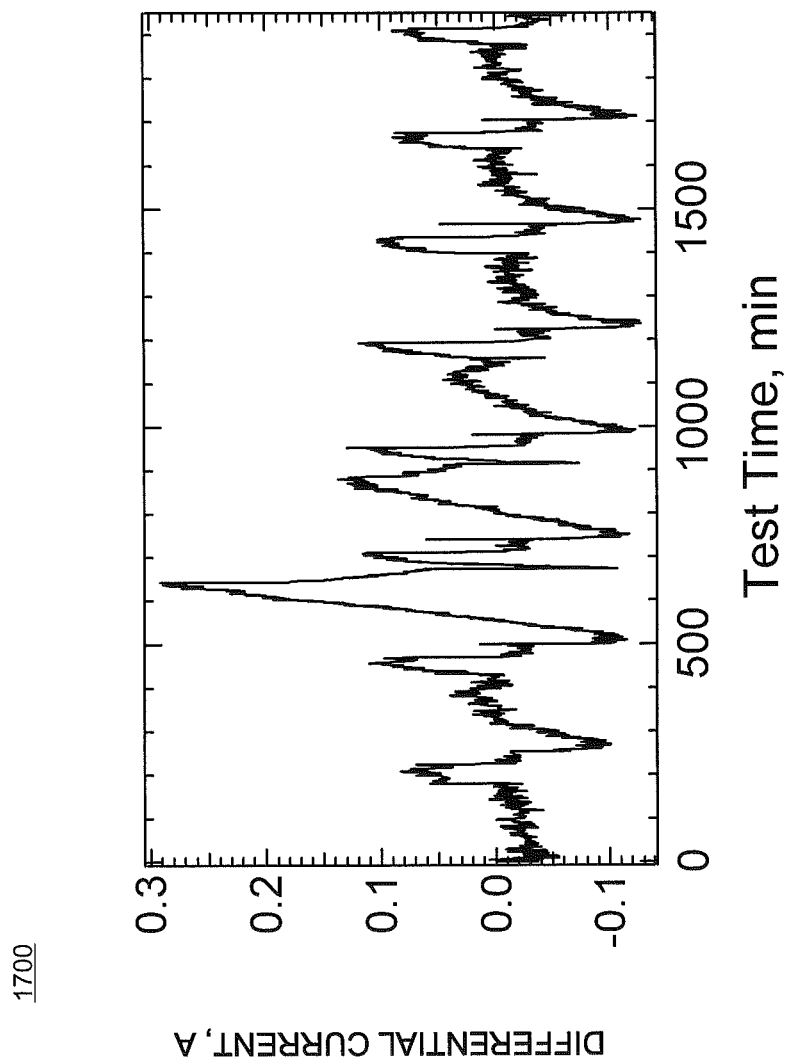
FIG. 17 shows a graph of differential current and total current data for a pair of example cells in parallel that include a short.

In the case of parallel batteries with a short, anomalous behavior of differential current as compared to total current may be observed. FIG. 17 shows a graph 1700 of a differential current waveform that indicates that one of the cells contains an internal short that appears when the cell pair was near peak operating voltage. Anomalous peaks in the waveform of graph 1700 at about 630 and 890 minutes correspond to current flow into the cell containing the internal short. Smaller peaks are also observed at approximately 400 and 1120 minutes where the magnitude of the short is smaller. In one signal processing technique, a signal of the type shown in FIG. 17 may be processed according to EQ. 1:

$$I_{result}(t) = I_{differential}(t) - \alpha[I_{total}(t)] \quad \text{EQ. 1}$$

Figure 18:
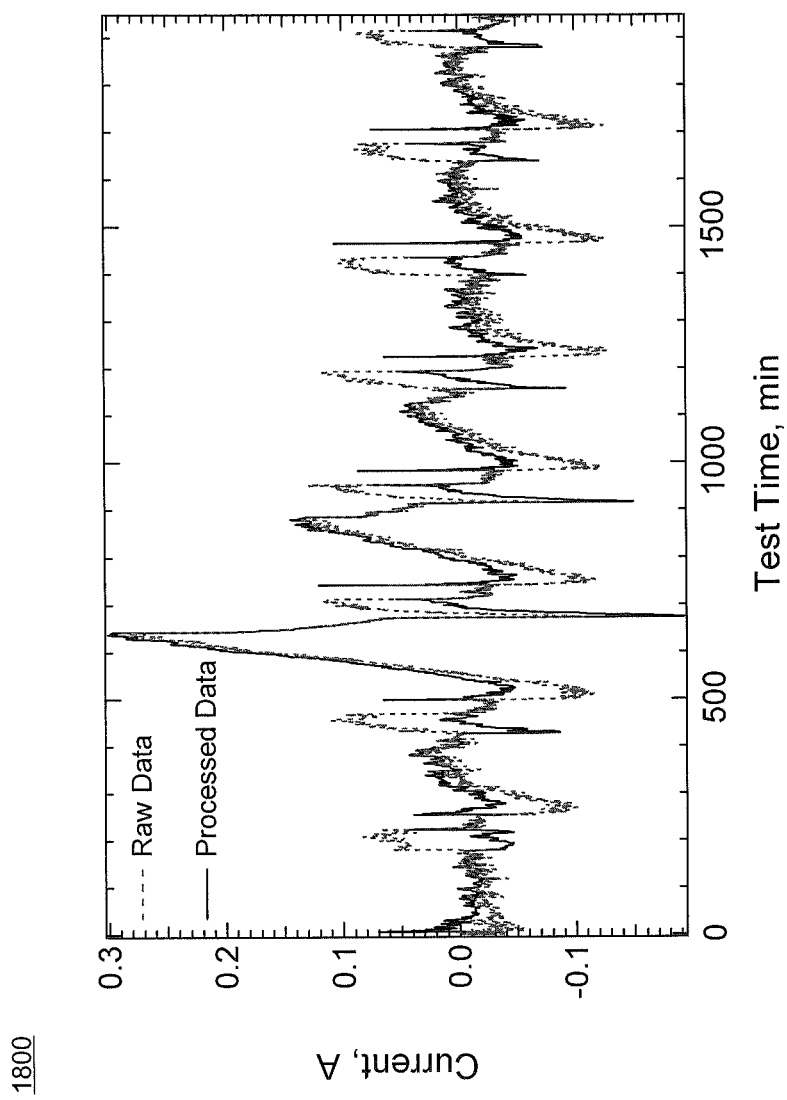
FIGS. 18-20 show graphs of the data of FIG. 17 after processing.

The scaling parameter a may be selected so as to minimize the amplitude of the differential current contribution arising from normal operation. FIG. 18 shows a graph 1800 of the result of application of EQ. 1 to the data of in FIG. 17, deconvoluting signal components associated with normal operation from those associated with the presence of a transient internal short. The signal component arising from normal charge-discharge processes is de-emphasized when analyzed, while current peaks associated with an intermittent short remain unchanged. The overall signal-to-background ratio for detection of the internal short is thus increased, making detection more sensitive.

Figure 19:
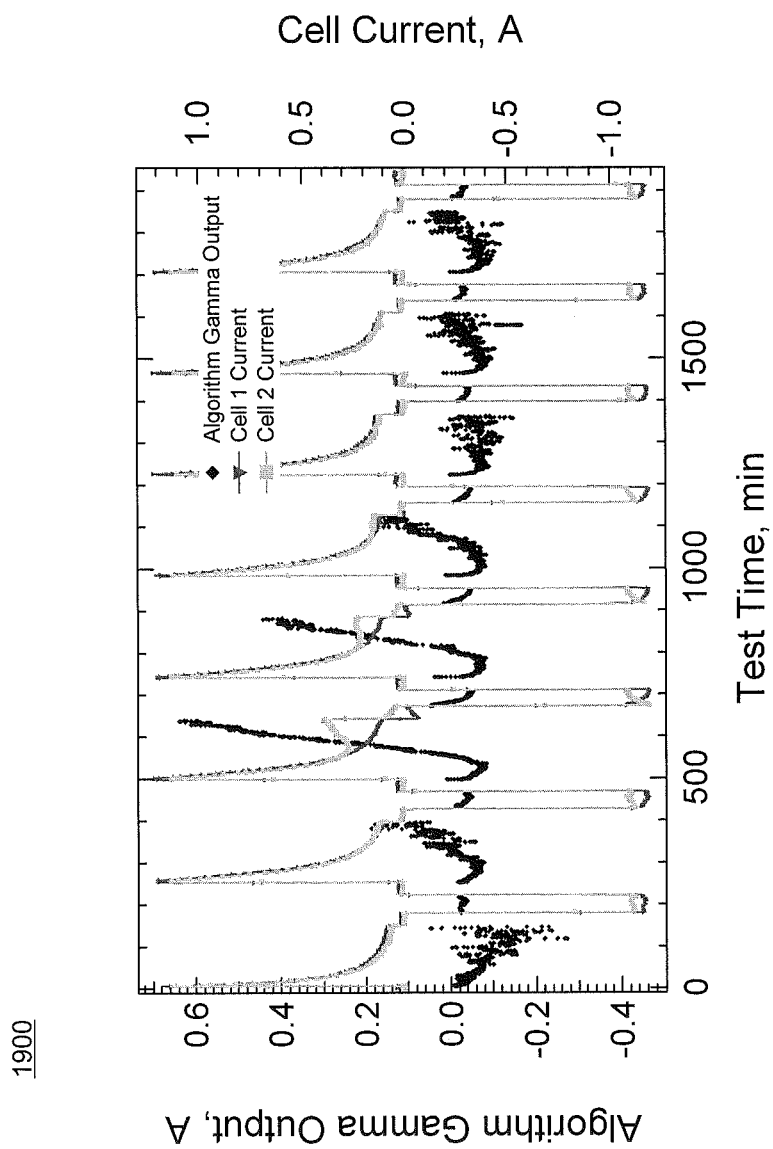

The sensitivity to differential current that is due to an internal short may also be increased using the differential current to total current quotient. Differential current in a parallel pair of cells may also be compared to total current to look for cases where the magnitude of the differential current is unusually large when evaluated as a ratio with respect to total current. FIG. 19 shows a graph 1900 of application of this analysis to the data shown in FIG. 17. The output of the analysis (referred to as "Gamma" in FIG. 19) is generated using EQ. 2:

$$\text{Output}(t) = I_{differential}(t)/I_{total}(t) \quad \text{EQ. 2}$$

The value of the quotient of the differential current and total current for the parallel pair of cells (cell 1 and cell 2) as shown in FIG. 19 is determined in order to identify periods where the differential current is disproportionately large with respect to total current, and thus indicative of an internal short in one or more of the cells. This type of analysis results in large amplitude signals associated with an internal short that forms at high voltage (toward the end of each of four charges), while ignoring differential current of similar magnitude during discharges which are not indicative of an internal short, as determined independently by cell temperature and charge-discharge efficiency (the short of FIG. 19 formed transiently toward the end of charging, then cleared when discharge began). During rest periods between charge and discharge steps when total current is zero, the quotient of differential current divided by total current is infinite and cannot be utilized. Other analysis techniques may be applied during rest periods.

Figure 20:
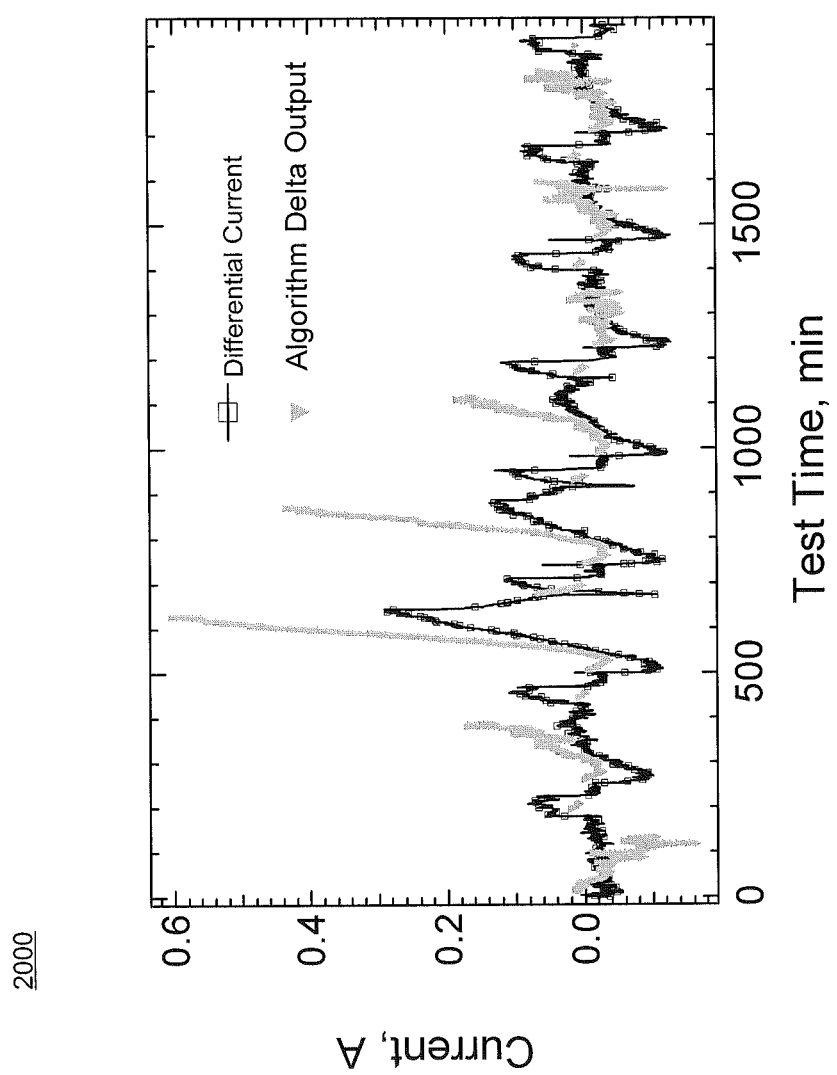

FIG. 20 shows a graph 2000 of a comparison of differential current and output of the processing algorithm based on the differential current to total current quotient, and shows relatively high sensitivity in the detection of differential current resulting from internal shorts. Application of EQ. 2 to the data of FIG. 19 gives four distinct peaks, each of which corresponds to occurrence of an internal short in one of the parallel cells, creating an output which gives relatively high amplitude markers for internal shorts than may be obtained from the differential current waveform alone.

Figure 21:
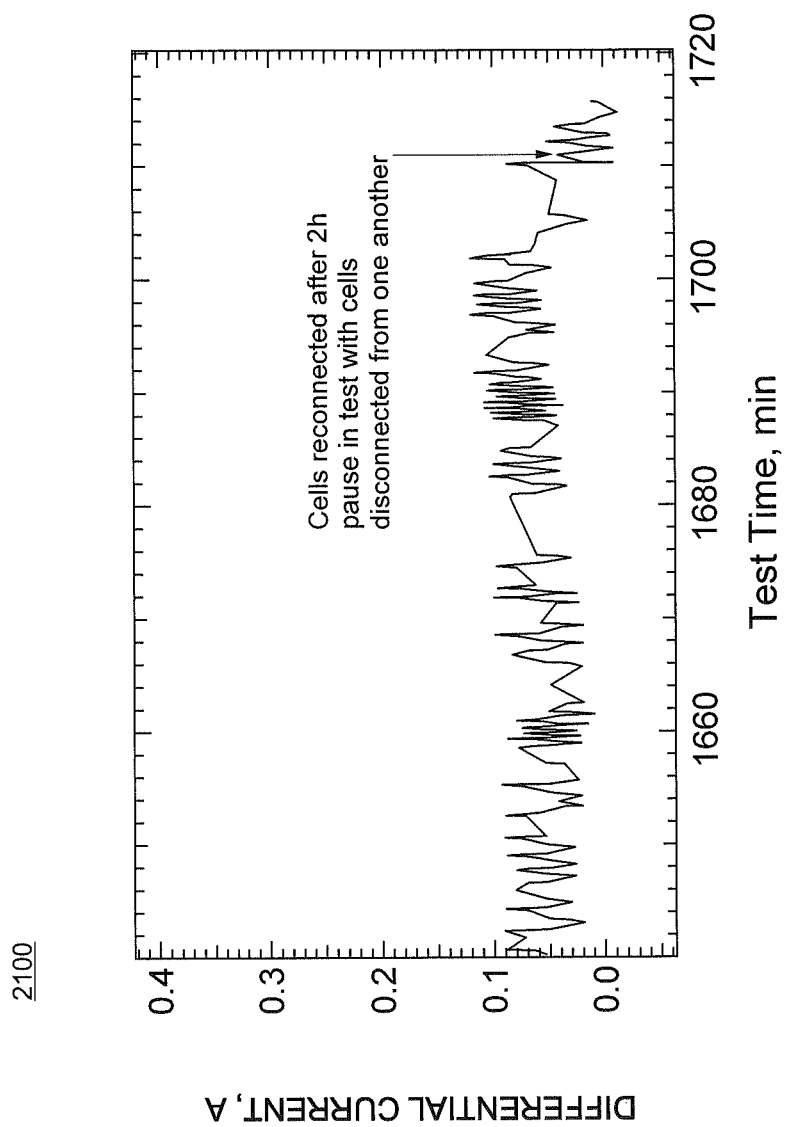
FIG. 21 shows a graph of differential current data for a pair of example short-free cells in parallel.
Figure 22:
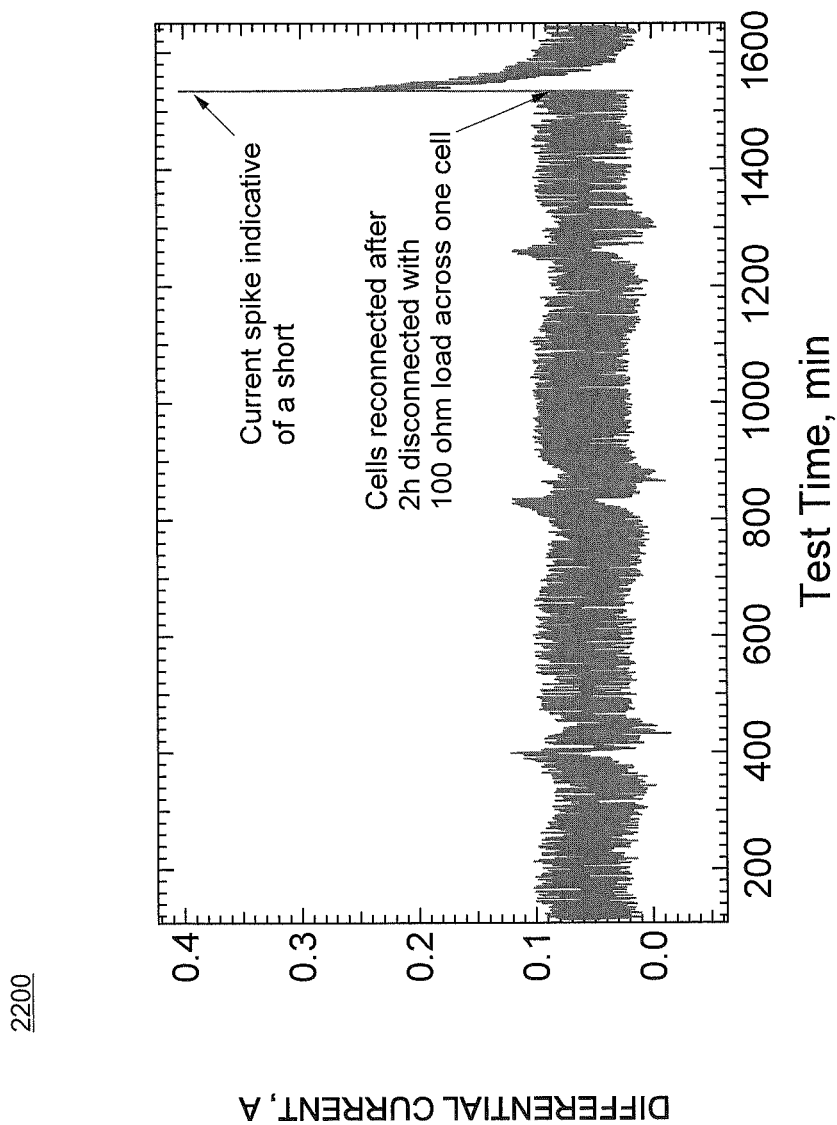
FIG. 22 shows a graph of differential current data for a pair of example cells in parallel that include a short.

FIG. 21 shows a graph 2100 of differential current data resulting from active interrogation of a pair of short-free parallel-connected lithium-ion cells, such as is described with respect to method 900 of FIG. 9, and FIG. 22 shows a graph 2200 of differential current data for similar batteries that include a short. The batteries are equilibrated, disconnected for a diagnostic time period, and reconnected. As shown in FIG. 21, when both cells were equilibrated prior to disconnection from one another, no current flowed upon reconnection because the cells remained at the same terminal voltage during the diagnostic time period. FIG. 22 shows differential current data that was collected under the same conditions as that presented in FIG. 21, but with a 100 ohm load placed across one cell, simulating the presence of a low-grade internal short circuit. The data in FIG. 22 shows that reconnection of the cells results in a large current spike comprising an inrush of current into the cell that had discharged into the 100 ohm load during the diagnostic time period, which in this case was 2 hours. This large spike in differential current can be easily identified, having a magnitude well beyond that of any value of differential current observed during cycling of the pair of cells in the presence of the 100 ohm load across one cell. FIG. 22 also includes differential current data for several charge-discharge cycles that occurred prior to disconnection and reconnection of the cells.

Battery, as used herein, refers to one or more cells, wherein each cell is a device that produces electricity by a chemical reaction. The one or more cells in a battery may be connected in parallel, in series, or any combination thereof.

The technical effects and benefits of exemplary embodiments include accurate detection of changes in battery characteristics based on differential current data.

The terminology used herein is for the purpose of describing particular embodiments only and is not intended to be limiting of the invention. As used herein, the singular forms "a", "an", and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

What is claimed is:

1. A system for determining battery internal short circuits based on inter-battery current monitoring, the system comprising:
    a first battery;
    a second battery, the second battery being connected in parallel with the first battery; and
    an inter-battery current measurement module comprising at least one current measuring device, the inter-battery current measurement module being configured to:
        determine an inter-battery current associated with the first battery and the second battery, the inter-battery current comprising a transfer of charge between the first battery and the second battery; and
        detect an internal short circuit in the first battery based on the determined inter-battery current, determine an average value of the inter-batter current over a predetermined time period, and detect the internal short circuit in the first battery based on the determined average value, wherein detecting the internal short circuit in the first batter based on the determined average value comprises detecting a shift in the magnitude in the average value of the inter-battery current during the predetermined time period.

2. The system of claim 1, wherein the inter-battery current measurement module comprises a first current measuring device and a second current measuring device, the inter-battery current measurement module configured to:

measure a first current associated with the first battery by the first current measuring device;

measure a second current associated with the second battery by the second current measuring device; and determine a difference between the first current associated with the first battery and the second current associated with the second battery, wherein the determined difference is the inter-battery current.

3. The system of claim 2, wherein the first and second current measuring devices each comprise one of a Hall Effect transducer, a current sense resistor, an induction sensor, a current shunt, and current sense resistor with amplification.

4. The system of claim 1, wherein the inter-battery current measurement module comprises a first current measuring device and a second current measuring device, the inter-battery current measurement module configured to:

measure a first current associated with one of the first battery and the second battery by the first current measuring device;

measure a total current of both the first battery and the second battery by the second current measuring device; and determine a difference between the first current associated with the first battery and the total current, wherein the determined difference is the inter-battery current.

5. The system of claim 4, wherein the first and second current measuring devices each comprise one of a Hall Effect transducer, a current sense resistor, an induction sensor, a current shunt, and current sense resistor with amplification.

6. The system of claim 1, further comprising a third battery;

a fourth battery, the second battery being connected in parallel with the third battery; and an additional inter-battery current measurement module configured to determine an inter-battery current associated with the third battery and the fourth battery, wherein the system is configured to compare the inter-battery current associated with the first battery and the second battery with the inter-battery current associated with the third battery and the fourth battery.

7. The system of claim 2, wherein the first current is not associated with the second battery, and wherein the second current is not associated with the first battery.

8. The system of claim 4, wherein the first current is associated with only one of the first battery and the second battery.

9. A system for determining battery internal short circuits based on inter-battery current monitoring, the system comprising:

a first battery;

a second battery, the second battery being connected in parallel with the first battery;

and an inter-battery current measurement module comprising a switch and a current measuring device located between the first battery and the second battery, the inter-battery current measurement module configured to:

determine a inter-battery current associated with the first battery and the second battery using the switch and the current measuring device, the inter-battery current comprising a transfer of charge between the first battery and the second battery; and detect an internal short circuit in the first battery based on the inter-battery current, wherein the switch and the current measuring device comprising a metal-oxide-semiconductor field effect transistor (MOSFET), and wherein the inter-battery current is determined based on a drain-source voltage of the MOSFET.

10. The system of claim 9, wherein the inter-battery current measurement module is configured to:

disconnect the first battery from the second battery by the switch;

wait for a diagnostic time period;

reconnect the first battery and the second battery by the switch based on elapsing of the diagnostic time period; and measure, by the current measuring device, a current flowing into the first battery from the second battery after the first battery and the second battery are reconnected by the switch, wherein the measured current comprises the inter-battery current.

11. The system of claim 9, wherein the inter-battery current measurement module is further configured to compare the determined inter-battery current to a minimum fault threshold to determine the presence of the internal short circuit in the first battery.

12. The system of claim 9, wherein the current measuring device comprises one of a Hall Effect transducer, a current sense resistor, an induction sensor, a current shunt, and current sense resistor with amplification.

13. The system of claim 9, wherein the switch comprises one of a relay, a solid state switch, a thyristor, and a mechanical switch.

14. The system of claim 9, wherein the first battery comprises a first cell and a second cell connected in parallel, and further comprises an additional inter-battery current measurement module comprising an additional switch and an additional current measuring device located between the first cell and the second cell, the additional current measurement module being configured to:

disconnect the first cell from the second cell using the additional switch after the presence of the internal short circuit in the first battery is determined;

wait for a diagnostic time period;

reconnect the first cell and the second cell using the additional switch based on elapsing of the diagnostic time period; and measure, using the additional current measuring device, a current flowing into the first cell from the second cell after the first cell and the second cell are reconnected by the additional switch; and detecting the internal short circuit in the first cell based on the measured current.

15. A method for determining battery internal short circuits based on inter-battery current monitoring, the method comprising:

determining an inter-battery current associated with a first battery and a second battery, the first battery being connected in parallel with the second battery, the inter-battery current comprising a transfer of charge between the first battery and the second battery; and detecting an internal short circuit in the first battery based on the determined inter-battery current, determine an average value of the inter-battery current over a predetermined time period, and detecting the internal short circuit in the first battery based on the determined average value, wherein detecting the internal short circuit in the first battery based on the determined average value comprises detecting a shift in the magnitude in the average value of the inter-battery current during the predetermined time period.

16. The method of claim 15, wherein determining the inter-battery current associated with a first battery and a second battery comprises:

determining a first current associated with the first battery;

determining a second current associated with the second battery; and determining a difference between the first current associated with the first battery and the second current associated with the second battery, wherein the determined difference is the inter-battery current.

17. The method of claim 15, further comprising determining an inter-battery current associated with a third battery and a fourth battery, the third battery being connected in parallel with the fourth battery; and comparing the inter-battery current associated with the first battery and the second battery with the inter-battery current associated with the third battery and the fourth battery.

18. The method of claim 15, further comprising:

disconnecting the first battery from the second battery by a switch that is located between the first battery and the second battery;

reconnecting the first battery and the second battery by the switch after elapsing of a diagnostic time period, wherein determining the inter-battery current associated with the first battery and the second battery is performed after the first battery and the second battery are reconnected; and comparing the determined inter-battery current to a minimum fault threshold to determine the presence of the internal short circuit in the first battery.

19. The method of claim 18, further comprising connecting the first battery and the second battery for a predetermined time period before disconnecting the first battery and the second battery, such that the first battery and the second battery are at a steady state before disconnecting the first battery and the second battery by the switch; and disconnecting the first battery from the second battery by the switch responsive to detection of the internal short circuit in the first battery.

20. The method of claim 18, wherein the first battery comprises a first cell and a second cell connected in parallel, and further comprises an additional inter-battery current measurement module comprising an additional switch located between the first cell and the second cell, the method further comprising:

disconnecting the first cell from the second cell after the presence of the fault in the first battery is determined by the additional switch;

reconnecting the first cell and the second cell after elapsing of a diagnostic time period;

determining an inter-battery current associated with the first cell and the second cell after the first cell and the second cell are reconnected; and comparing the determined inter-battery current to a minimum fault threshold to determine the presence of the internal short circuit in the first cell.

* * * * *